(12) United States Patent
Salahuddin et al.

(10) Patent No.: US 12,424,276 B2
(45) Date of Patent: Sep. 23, 2025

(54) MULTIPORT MEMORY CELLS INCLUDING STACKED ACTIVE LAYERS

(71) Applicant: IMEC VZW, Leuven (BE)

(72) Inventors: Shairfe Muhammad Salahuddin, Kessel Lo (BE); Julien Ryckaert, Schaerbeek (BE)

(73) Assignee: IMEC VZW, Leuven (BE)

(*) Notice: Subject to any disclaimer, the term of this patent is extended or adjusted under 35 U.S.C. 154(b) by 48 days.

(21) Appl. No.: 18/068,330

(22) Filed: Dec. 19, 2022

(65) Prior Publication Data

US 2023/0206996 A1 Jun. 29, 2023

(30) Foreign Application Priority Data

Dec. 20, 2021 (EP) .................................... 21215860

(51) Int. Cl.
| | | |
|---|---|---|
| *G11C 11/41* | (2006.01) | |
| *G11C 11/419* | (2006.01) | |
| *H01L 23/522* | (2006.01) | |
| *H01L 23/528* | (2006.01) | |
| *H01L 25/16* | (2023.01) | |
| *H10B 10/00* | (2023.01) | |
| *H10B 80/00* | (2023.01) | |

(52) U.S. Cl.
CPC ........ *G11C 11/419* (2013.01); *H01L 23/5226* (2013.01); *H01L 23/5283* (2013.01); *H01L 25/16* (2013.01); *H10B 10/12* (2023.02); *H10B 80/00* (2023.02)

(58) Field of Classification Search
CPC ............... G11C 11/419; H01L 23/5226; H01L 23/5283; H01L 25/16; H01L 27/0207; H01L 27/0688; H10B 10/12; H10B 80/00
See application file for complete search history.

(56) References Cited

U.S. PATENT DOCUMENTS

| | | | |
|---|---|---|---|
| 10,083,739 B2* | 9/2018 | Lin ........................ H01L 25/50 |
| 2003/0090924 A1 | 5/2003 | Nii | |
| 2008/0291767 A1 | 11/2008 | Barnes et al. | |
| 2014/0269022 A1 | 9/2014 | Xie et al. | |
| 2014/0291731 A1* | 10/2014 | Becker ................. H10D 64/517 |
| | | | 257/206 |

(Continued)

OTHER PUBLICATIONS

Extended European Search Report in European Patent Application No. 21215860.4 dated May 27, 2022.

(Continued)

*Primary Examiner* — Xiaochun L Chen
(74) *Attorney, Agent, or Firm* — Knobbe, Martens, Olson & Bear, LLP (57) ABSTRACT

A multiport memory cell for register files is disclosed. Vertically stacked top and bottom tier of the memory cell are electrically interconnected through a pair of vias and comprise each an active device layer and a metal layer stack. The memory cell is partitioned to have a latching circuit and at least one write port located in the bottom tier and at least two read ports in the top tier. A word line trace for controlling the at least one write port is formed in the bottom tier metal layer stack and comprises two terminal sections and one intermediate section oriented perpendicularly to the terminal sections. The intermediate section is arranged between the pair of vias in a height direction of the memory cell.

21 Claims, 6 Drawing Sheets

(56) References Cited

U.S. PATENT DOCUMENTS

2016/0276019 A9     9/2016  Lin et al.
2017/0294448 A1*   10/2017  Debacker .......... H01L 27/11807
2019/0312023 A1    10/2019  Morrow et al.

OTHER PUBLICATIONS

Gopireddy, B. et al., "Designing Vertical Processors in Monolithic 3D", *The 46$^{th}$ Annual International Symposium on Computer Architecture (ISCA '19)*, 2019, pp. 643-656.

Salahuddin, S. M. et al., "SRAM With Buried Power Distribution to Improve Write Margin and Performance in Advanced Technology Nodes", *IEEE Electron Device Letters*, 2019, vol. 40, No. 8, pp. 1261-1264.

Srinivasa, S. et al., "A Monolithic-3D SRAM Design with Enhanced Robustness and In-Memory Computation Support", *ISLPED'18*, 2018, in 6 pages, https://doi.org/10.1145/3218603.3218645.

Srinivasa, S. et al., "Compact 3-D-SRAM Memory With Concurrent Row and col. Data Access Capability Using Sequential Monolithic 3-D Integration", *IEEE Transactions On Very Large Scale Integration (VLSI) Systems*, 2018, vol. 26. No. 4, pp. 671-683.

Weckx, P. et al., "Sequential 3D standard cell 4T architecture using design crenellation and self-aligned MOL for N2 technology and beyond", *Proc. of SPIE*, 2020, vol. 11328, 113280A-1-113280A-6.

\* cited by examiner

MULTIPORT MEMORY CELLS INCLUDING STACKED ACTIVE LAYERS

CROSS-REFERENCE TO RELATED APPLICATIONS

This application claims foreign priority to European Patent Application 21215860.4, filed Dec. 20, 2021, the content of which is incorporated by reference herein in its entirety.

BACKGROUND

Field

The present disclosure relates to multiport memory cells that comprise vertically stacked tiers of active device.

Description of the Related Technology

The implementation of dense multiport static random access memory (SRAM) arrays for register files is known to be challenging. In register files, the memory cells are equipped with multiple read and write ports, which contribute significantly to the footprint of the unit cell and thus form an obstacle towards a further miniaturization of register files.

The advent of vertical integration, in particular three-dimensional (3D) stacking technologies, provides a new tool for the design of memory-based integrated circuits. 3D stacking technology offers the possibility to arrange some of the active components of a functional circuit or unit on a substrate that is separate from and vertically spaced with respect to another substrate which contains the remaining components composing the functional circuit or unit. The respective substrates are electrically interconnected to enable electrical signal propagation between the circuit components located on different substrates. Therefore, continued scaling of the footprint can be achieved at the cost of more advanced manufacturing techniques. This is particularly true for circuitry that comprises logic components as well as memory components. The availability of an additional dimension also opens up the possibility to rethink the fundamental principles of circuit design.

3D SRAM cells, in which the read and write ports are located on different tiers, have been described in scientific literature. For example, S. Srinivasa et al., "Compact 3-D-SRAM Memory With Concurrent Row and Column Data Access Capability Using Sequential Monolithic 3-D Integration", IEEE Transactions on Very Large Scale Integration (VLSI) Systems, vol. 26, no. 4, pp. 671-683, April 2018, describe a compact 3D SRAM memory.

There is a need for a multiport memory cell that can be standardized and is compliant with the strict design rules governing the manufacturability of a dense arrangement of a large number of such memory cells.

SUMMARY OF CERTAIN INVENTIVE ASPECTS

It is an object of embodiments of the present disclosure to provide a vertically stacked multiport memory cell, for example for use in multiport register files, which is compliant with the strict design rules governing the manufacturability of compact memory cells in advanced technology nodes.

The above objective is accomplished by a method and devices according to the present disclosure.

The present disclosure relates to a multiport memory cell which can be used in register files, for example. The memory cell comprises two vertically stacked tiers referred to as the bottom tier and the top tier, and each tier comprises an active device layer and a metal layer stack. The bottom and top tier are electrically interconnected, in the memory cell, through a pair of vias. The memory cell is partitioned to have a latching circuit and at least one write port located in the bottom tier and at least two read ports located in the top tier. A write word line trace for controlling the at least one write port is formed from interconnected metal wires of the bottom tier metal layer stack and comprises two terminal sections and one intermediate section oriented substantially perpendicularly to each one of the two terminal sections. The intermediate section is arranged between the pair of vias in a height direction of the memory cell.

Short-circuit formation between the inter-tier vias and the metal layers of the bottom tier back-end-of-line stack is prevented due to the sectioned write word line trace in the bottom tier, which follows a non-straight, angled path that optimizes minimum spacing constraints between the inter-tier vias and the metal layers of the bottom tier.

The memory cell of the present disclosure has the advantage that a layout of the memory cell can be standardized to simplify tiling of a large number of identical memory cells into a dense memory array, for instance the memory array of a dense register file. Moreover, the memory cell of the present disclosure fulfils the strict layout design rules governing the manufacturability of a dense tiling of such memory cells into an array structure.

It is an advantage of embodiments of the disclosure that a footprint of the memory cell can be reduced, which allows for lower wafer and die costs.

It is an advantage of embodiments of the disclosure that the length of word lines (read, write) can be reduced, thereby decreasing access latency.

It is an advantage of embodiments of the disclosure that access performance, e.g., read latency, can be improved for memory structures that use an array of memory cells according to the disclosure. Besides, an array of memory cells according to the disclosure may comprise a plurality of segmented local read bit lines, which further improves the read speed.

The stacked design (e.g., 3D sequential) of a memory cell according to the disclosure, as compared to planar designs of a multiport bit cell, has the benefit that the gate/poly length can be reduced, whereby the associated node capacitance is lowered.

Partitioning the memory cell to have the at least one write port located on the bottom tier and the at least two read ports located on the top tier is advantageous, because mid-bandgap gate work function materials can be used for the bottom tier active devices and large-bandgap gate work function materials for top tier active devices. Higher read speed, which generally defines the clock speed, can thus be obtained if read ports are arranged on the top tier, while some reduction in the already greater write speed can be tolerated. The use of mid-bandgap gate work function materials for the bottom tier active devices has the further advantage that a higher thermal budget is available for the processing of the top tier. This allows for improved performances of the top tier active devices.

The disclosure also relates to a method of manufacturing the inventive multiport memory cell as well as to a set of photomasks whose geometrical features define corresponding features of the inventive multiport memory cell.

Particular and preferred aspects are set out in the accompanying independent and dependent claims. Features from the dependent claims may be combined with features of the independent claims and with features of other dependent claims as appropriate and not merely as explicitly set out in the claims.

For purposes of summarizing the present disclosure and the advantages achieved over the prior art, certain objects and advantages have been described herein above. Of course, it is to be understood that not necessarily all such objects or advantages may be achieved in accordance with any particular embodiment of the disclosure. Thus, for example, those skilled in the art will recognize that the disclosure may be embodied or carried out in a manner that achieves or optimizes one advantage or group of advantages as taught herein without necessarily achieving other objects or advantages as may be taught or suggested herein.

The above and other aspects and implementations will be apparent from and elucidated with reference to the embodiment(s) described hereinafter.

BRIEF DESCRIPTION OF THE DRAWINGS

The above-described aspects and implementations will now be described further, by way of example, with reference to the accompanying drawings, in which.

The drawings are only schematic and are non-limiting. In the drawings, the size of some of the elements may be exaggerated and not drawn to scale for illustrative purposes. The dimensions and the relative dimensions do not necessarily correspond to actual reductions to practice of the disclosure.

Any reference signs in the claims shall not be construed as limiting the scope.

In the different drawings, the same reference signs refer to the same or analogous elements.

DETAILED DESCRIPTION OF CERTAIN ILLUSTRATIVE EMBODIMENTS

The present disclosure will be described with respect to particular embodiments and with reference to certain drawings but the scope of the disclosure is not limited thereto but only by the claims.

It is to be noticed that the term "comprising", used in the claims, should not be interpreted as being restricted to the means listed thereafter; it does not exclude other elements or steps. It is thus to be interpreted as specifying the presence of the stated features, integers, steps, or components as referred to, but does not preclude the presence or addition of one or more other features, integers, steps, components, or groups thereof. Thus, the scope of the expression "a device comprising A and B" should not be limited to devices consisting only of A and B.

Reference throughout this specification to "one embodiment" or "an embodiment" means that a particular feature, structure, or characteristic described in connection with the embodiment is included in at least one embodiment. Thus, appearances of the phrases "in one embodiment" or "in an embodiment" in various places throughout this specification may, but do not necessarily, refer to the same embodiment. Furthermore, the particular features, structures, or characteristics may be combined in any suitable manner, as would be apparent to one of ordinary skill in the art from this disclosure, in one or more embodiments.

Similarly, it should be appreciated that in the description of exemplary embodiments, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that more features than are expressly recited in each claim are required. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment.

Furthermore, while some embodiments described herein include some but not other features included in other embodiments, combinations of features of different embodiments are meant to be within the scope of the disclosure, and form different embodiments, as would be understood by those in the art.

In the description provided herein, numerous specific details are set forth. However, it is understood that embodiments may be practiced without these specific details. In other instances, well-known methods, structures, and techniques have not been shown in detail in order not to obscure an understanding of this description.

In the context of the present disclosure, a design layout, integrated circuit layout (view), integrated circuit mask layout, or mask design all relate to collections of geometrical shapes, organized into layers, which have a direct correspondence to patterns/features in material layers of an integrated circuit, e.g., such as transistors or transistor components, vias, wires, and contacts. This includes the layers formed in or on the semiconductor substrate as well as layers that are part of an interconnect structure (e.g., a metal layer stack) formed over the substrate. The geometric features of the design layout can be defined before physical verification of the design (e.g., by design rule checks). Once past the physical verification, design layout features may be modified in order to compensate for aberrations and systematic deviations in the fabrication flow. However, this does not change the identity, function, or connectivity of the corresponding patterns/features in material layers of the integrated circuit. In contrast to a circuit diagram, a design layout places and connects all the components that make up the integrated circuit and also takes key performance figures such as performance, size, density, and manufacturability into account.

As used herein, the height direction (x) and width direction (y) refer to orthogonal directions within a planar surface, for example a plane substantially parallel to a top major surface of a wafer or substrate. In the stacked embodiments described herein, the top tier and bottom tier can be stacked vertically in a direction (z) orthogonal to the height direction (x) and the width direction (y).

Figure 1:
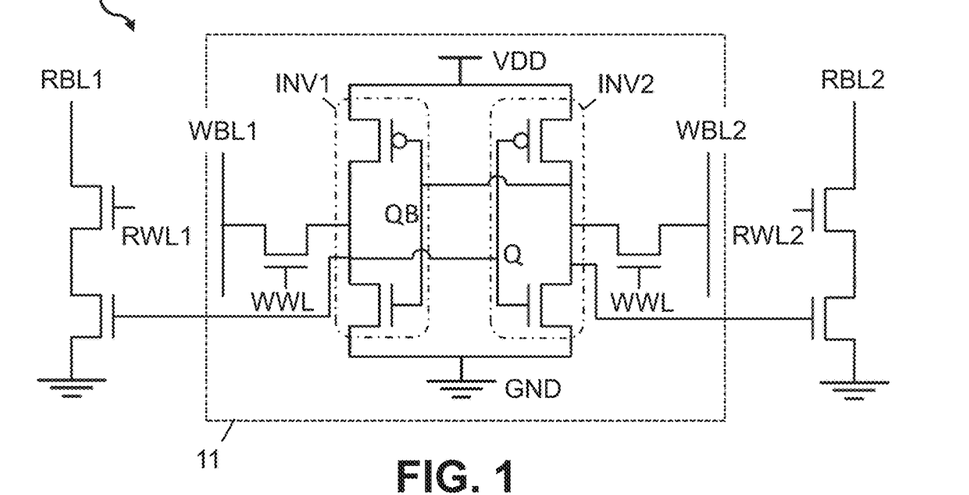
FIG. 1 is a circuit diagram of a conventional multiport SRAM bit cell with one write port and two independent read ports.

FIG. 1 is a circuit diagram of a conventional multiport SRAM bit cell 10 which has one write port and two independent read ports. SRAM cells of this kind are typically implemented in planar CMOS technology and can be integrated into dense memory arrays. For example, the multiport SRAM cell can be used as bit cell in a register file, first in first out (FIFO) buffer, shared data structures, or a binary content-addressable memory (BCAM) or caches, for example for address matching in lookup tables or the like. In these exemplary applications, it can be advantageous to allow for multiple, concurrent read/write accesses that are carried out in one cycle in a non-blocking fashion. This can help to reduce access latency and collisions in applications in which data is requested frequently and unpredictable delay cannot be tolerated or severely impacts the requester's performance.

The SRAM cell 10 is operably connectable to a first read bit line RBL1 through a first read port, a second read bit line RBL2 through a second read port, and a differential write bit line pair WBL1, WBL2 through the write port. In SRAM cell 10, the two access transistors of the write port (e.g., a differential write port) are controlled by a common write word line WWL, whereas the access transistor of each read port (e.g., isolated, single-ended read ports) is controlled by a separate read word line RWL1, RWL2. External clocking and access logic for the SRAM bit cell are not shown in the figure. Two cross-coupled inverters INV1 and INV2 form a latching circuit that stores the internal states Q, QB of the bit cell statically, as long as the bit cell is actively connected to the power supply VDD and GND. A core portion 11 of the SRAM bit cell is formed by the six transistors of the latching circuit and the write port. For example, the core portion 11 of the SRAM cell can correspond to a standard 6T SRAM cell.

High density of bit cells and low power consumption are further criteria that a multiport SRAM memory can be generally optimized for. However, each additional port, the word line controlling it, and the related wiring increase the semiconductor area (e.g., silicon area on the chip) occupied by the multiport SRAM bit cell significantly. The area needed for adding a larger number of ports quickly becomes prohibitive, and the parasitic capacitances can increase in the enlarged bit cell relative to a smaller cell.

Figure 2:
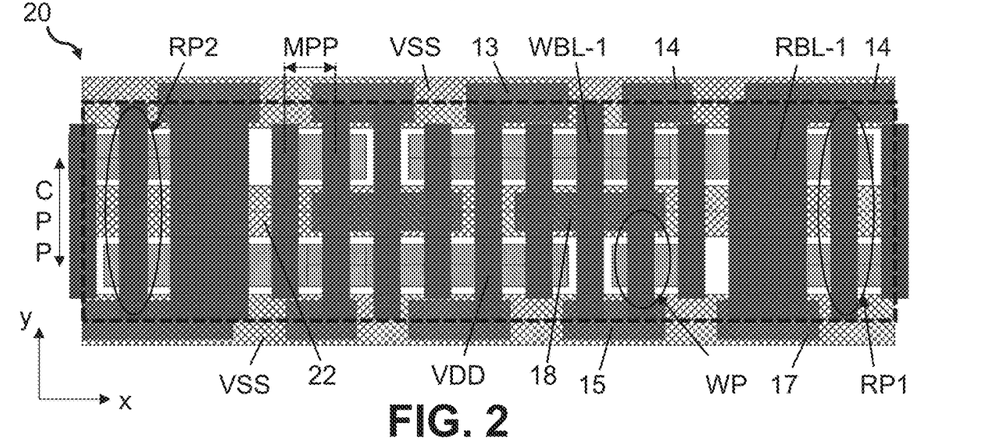
FIG. 2 shows a design layout of a conventional planar SRAM bit cell with one write port and two independent read ports.

Referring now to FIG. 2, a design layout of a conventional planar 2R/1 W SRAM bit cell 20 (e.g., as described on the circuit level in FIG. 1) is shown in top-down view. The bit cell design has a discrete 180° rotation symmetry (about its center point) and the cell boundary is indicated by the dashed contour line. A double-ended write port WP and two isolated single-ended read ports RP1, RP2 can control write and read access to the bit cell 20, respectively, via one write word line 22 and two independent read word lines (not shown). Contact pads 13 and 14 can connect the bit cell 20 to a positive voltage supply line (e.g., VDD) and reference voltage supply line (e.g., VSS) respectively, while contact pads 15 and 17 can connect the bit cell to a first one of a pair of differential write bit lines, WBL-1, and a first one of two separate read bit lines, RBL-1, respectively. Internal contact 18 can store the internal state Q of the bit cell 20. The positive voltage supply line VDD as well as the read and write bit lines can be operably connectable to bit cell 20 and can be formed on an internal metal layer of the middle-of-line stack. Reference voltage supply line VSS and write word line 22 can be formed on a first metal layer of the back-end-of-line stack formed over the middle-of-line stack. Write word line 22 can connect to the gate of the read ports through a metal wire strip on the internal metal layer of the middle-of-line stack, for example via the vertically aligned strips (in y-direction) on the bit cell boundary at both ends of the bit cell. The two read word lines can be located in a third metal layer of the back-end-of-line stack. Contact pads 13-18 can be patterned in a buried metal layer of the active device layer substrate.

The SRAM cell 20 is designed as a thin cell, for which a cell dimension in the width direction y (e.g., the cell width) can correspond to approximately two times the contacted poly pitch (CPP), also referred to as the contacted gate pitch. Using a 2-nm technology node, for example, a thin SRAM cell of width 2*CPP can measure about 80-90 nm in the cell width direction. In contrast to a single-port 6T SRAM cell, for which a cell dimension in the height direction x (e.g., the cell height) generally corresponds to eight times the minimum metal pitch (MMP) (e.g., the MMP of the MOL stack if present), the multiport SRAM cell 20 can have a cell height that is substantially larger (e.g., about 16*MMP in this example). This can lead to a 100% area increase of the multiport SRAM cell 20 compared to its single-port counterpart, which makes a dense integration of multiport SRAM cells in an arrayed memory structure challenging in a planar architecture. Moreover, the lengths of the read word line traces for controlling the first and second (single-ended) read port RP1, RP2 and the write word line trace 22 for controlling the double-ended write port WP of the SRAM cell 20 can be increased by the same factor, which can negatively impact the time delay for accessing the bit cell.

Tighter dimensions of multiport SRAM bit cells, more favorable for the implementation of dense multiport SRAM memory arrays, can be obtained by partitioning the multiport bit cell to have a tight core portion, including the latching circuit and one or more write ports, arranged in a bottom tier and the read ports arranged in a top tier. Expressed differently, the footprint of the multiport SRAM bit cell can be reduced in a vertically stacked architecture as compared to a fully planar architecture. Footprint, in the context of vertically stacked memory cells, means the area measure of the two-dimensional projection of the layers of the stacked memory cell along the stacking direction (e.g., the cross-sectional area of the stacked memory cell in a plane perpendicular to the stacking direction of the tiers). In a planar architecture, the footprint of the memory cell is equal to its area measure. Vertical stacking of two (or more) tiers can be obtained with 3D sequential integration technologies. As a result thereof, it is possible to realize stacking of transistors (e.g., not being restricted to only planar arrangements) and stacking of semiconductor dies (e.g., CMOS dies) more generally. This allows the CMOS functionality per die area to be increased and thus fuels further scaling and densification of integrated circuits. In particular, it is possible to split integrated circuit parts that have different functionality, require different design rules, and/or have conflicting design optimizations, and further allows the co-integration of heterogeneous technologies on different tiers of a same wafer within a single fabrication flow. For instance, it is possible to implement stacked dies in which a memory array is provided underneath a functional or logic circuit layer, also referred to as array under CMOS (AuC).

Figure 3:
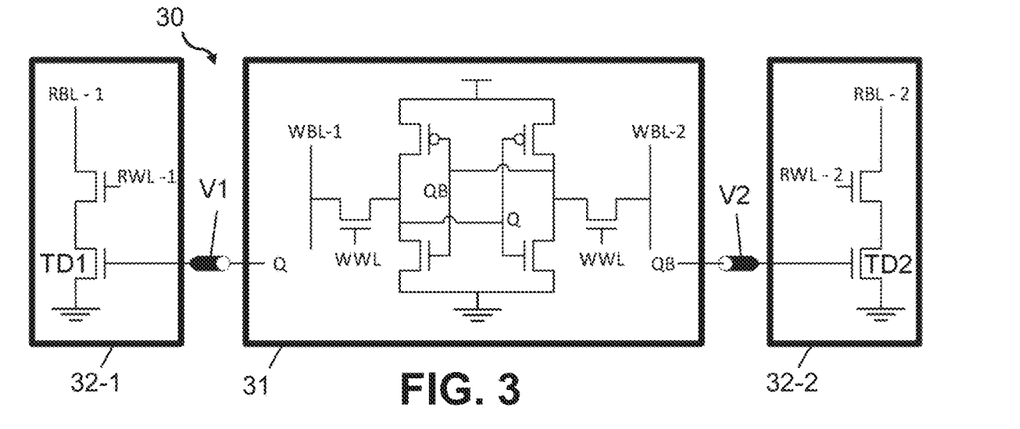
FIG. 3 illustrates, on a circuit level, a partitioning of the multiport SRAM cell of FIG. 1 over a bottom tier and a top tier.

FIG. 3 illustrates, on a circuit level, how different parts of the multiport SRAM cell of FIG. 1 can be partitioned over a bottom tier and a top tier. According to the partition, the compact core portion 31 of the SRAM bit cell 30, comprising the differential write port and the latching circuit, can be assigned to the bottom tier, while the two isolated, single-ended read ports can be assigned to the top tier. The bottom tier can be electrically connected to the top tier by means of a pair of inter-tier vias V1 and V2, also designated as super-vias. More specifically, the super-vias are positioned to connect the internal storage nodes of the core portion 31 to the drive transistor gates of the first and second read port. For example, the first super-via V1 can supply the internal state Q of the bit cell to the gate of the drive transistor TD1 of the first read port 32-1, and the second super-via V2 can supply the internal state QB of the bit cell to the gate of the drive transistor TD2 of the second read port 32-2. This partitioning of the SRAM bit cell has the advantage that the tight core portion 31 can be preserved in the bottom tier, thus allowing a dense integration of the SRAM bit cell core portions in the bottom tier of a multiport SRAM memory, while the top tier offers additional die area for the transistors of the read ports.

Figure 4:
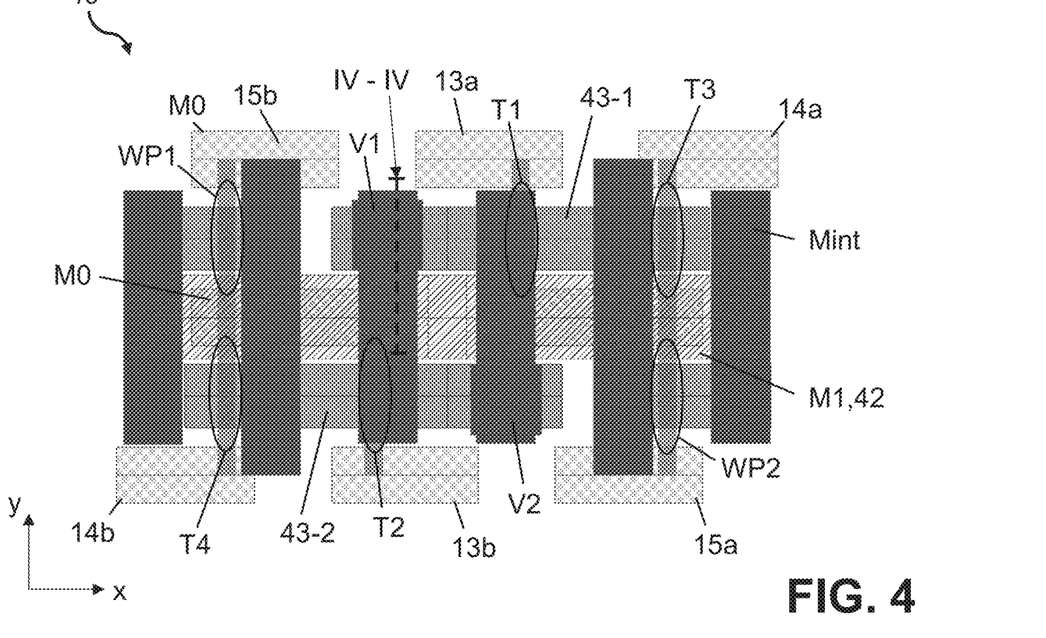
FIG. 4 shows a modified design layout of a standard single-port 6T SRAM cell in the bottom tier in top-down view.
Figure 5:
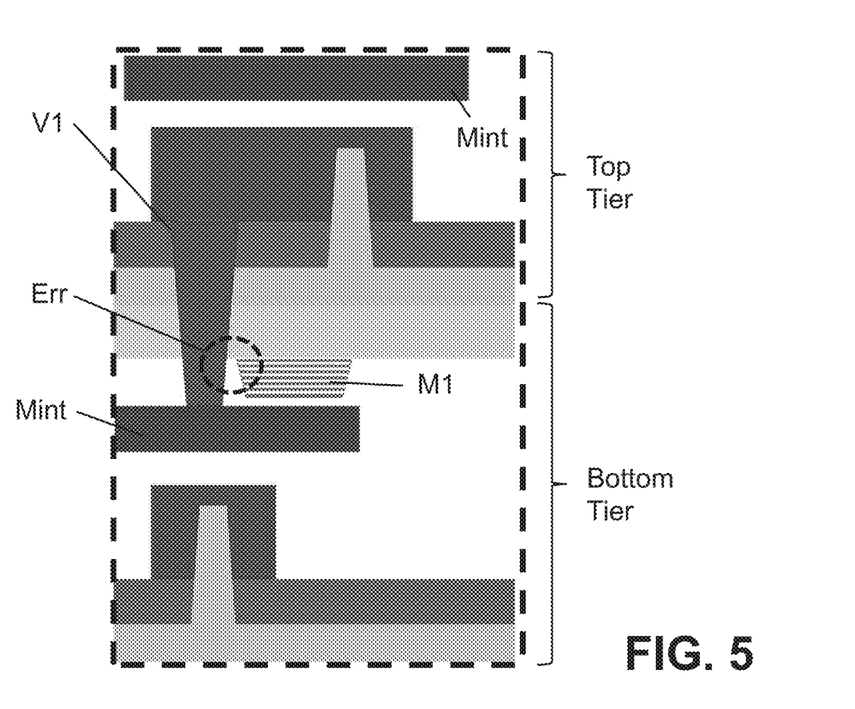
FIG. 5 is a simplified cross-sectional view of a portion of the modified SRAM bit cell in FIG. 4.

Referring now to FIG. 4 and FIG. 5, technical difficulties arising from a straightforward modification of the design layout of a standard single-port 6T SRAM cell into a partitioned (e.g., two-tier) multiport SRAM cell are described, the partitioning of the multiport SRAM bit cell over a bottom and top tier corresponding to the one just described with respect to FIG. 3.

FIG. 4 shows the modified design layout of a standard single-port 6T SRAM cell in the bottom tier in top-down view. The bottom tier portion of the modified SRAM bit cell 40 corresponds to a conventional thin SRAM bit cell having a six-transistor core portion, (e.g., a 6T thin cell). Here, a thin SRAM cell has the same meaning as described above (e.g., the SRAM bit cell dimension in the width direction y corresponding to approximately two times the contacted poly pitch). The bottom tier portion of bit cell 40 can comprise a front-end-of-line (FEOL) portion, which includes the active devices that are patterned into the semiconductor substrate (e.g., silicon), giving rise to a bottom tier active device layer. Active devices in the bottom tier active device layer can include the four transistors T1-T4 that form the latching circuit (e.g., a pair of cross-coupled inverters) and the two transistors WP1, WP2 that constitute the write ports to the internal storage nodes of the SRAM bit cell. The internal storage nodes are the nodes that store the internal states of the memory cell, e.g., the two complementary states Q and QB already mentioned above.

In the bottom tier, a metal layer stack is formed over the FEOL portion, for example over the bottom tier active device layer. This metal layer stack can comprise a plurality of metal/metallization layers and inter-metal dielectrics, and can form the interconnect fabric of the SRAM bit cell and, more generally, the interconnect structure of the integrated chip comprising a plurality of such SRAM bit cells. The bottom tier metal layer stack can include a back-end-of-line (BEOL) stack and a middle-of-line (MOL) stack, wherein the MOL stack is interposed between and electrically contacts the bottom tier active device layer and the BEOL stack. In the SRAM bit cell 40, the MOL stack can include a single metallization layer Mint for connecting the cross-coupled inverters of the latching circuit and for contacting the word line trace with the transistor gates of the write port. With a cell height dimension corresponding to about five times the MMP of the bottom tier metal layer stack, more precisely about five times the MMP of the Mint layer, the design layout of the bit cell 40 can be very compact.

In the bottom tier of FIG. 4, the BEOL stack can comprise at least one metal layer M1 (and typically much more) on which the word line trace 42 is formed and routed in the x-direction (cell height direction). The metal routing direction of the lowest (e.g., at least up to the second, third, or fourth layer) or all metallization layers in the bottom tier metal layer stack can be substantially unidirectional, meaning that metal lines, wires, contact pads, and the like are extending along a single, principal direction in each metal layer of the metal layer stack. Additionally, the principal routing direction can alternate between adjacent metallization layers of the set of restricted routing metallization layers of the metal layer stack/interconnect structure, for example, alternating between preferential routing in the y-direction and the x-direction. Therefore, the word line trace 42 on the first metal layer M1 of the BEOL stack can be oriented perpendicularly to the contact wire traces on the metal layer Mint of the MOL stack in FIG. 4. Restricting or partially restricting the alternating patterning directions (e.g., one-dimensional instead of two-dimensional) of the lower metallization layers of the interconnect structure is a common design rule to be obeyed in advanced technology nodes, for example sub-5 nm nodes.

Bit cell contact pads 13a-b, 14a-b, and 15a-b can be metal contacts formed in the bottom tier substrate and can extend downwards from the bottom tier active device layer of the SRAM bit cell 40. These metal contacts can be self-aligned with the transistor gates on the active device layer and can be in contact (e.g., directly in contact) with an epitaxial silicon layer of a wafer, hence not requiring any vias. Contact pads 13a-b can connect transistor junctions, where present, to the positive supply voltage rail (e.g., VDD power rail, not shown) and bit cell contact pads 15a, 15b can connect (different) transistor junctions, where present, to the reference supply voltage rail (e.g., GND power rail, not shown). In contrast thereto, contact pads 14a. 14b can connect transistor junctions of the write port to the differential pair of write bit lines (e.g., WBL1, WBL2 in FIGS. 1 and 3, not shown in FIG. 4). The power rails (e.g., VDD and GND), as well as the write bit lines can be buried in the bottom tier substrates (e.g., underneath the active device layer) or provided on the backside of the bottom tier substrate (which can also be underneath the active device layer).

To enable electrical interconnection between the bottom tier and the vertically stacked top tier, the 6T standard SRAM cell core portion can be modified by adding two inter-tier vias V1 and V2. Each one of the inter-tier vias V1, V2 can be positioned on a respective gate (e.g., a polysilicon gate) of the latching circuit or on a metal contact on the internal metallization layer Mint of the bottom tier metal layer stack that abuts directly on a gate of the latching circuit, in order to tap the respective internal state and supply it to the top tier, where it can be read out from the readout ports.

FIG. 5 is a simplified cross-sectional view (showing only the relevant material layers) along the line IV-IV in the modified SRAM bit cell of FIG. 4, which explains how the inter-tier via V1 extends from the bottom tier towards and into the top tier and connects the MOL metal layer Mint of the bottom tier to the transistor gate/poly line of the top tier. A major problem with this approach is that the inter-tier vias are placed too close to the first metal layer M1 of the bottom tier BEOL. Too close means that the design layout for the modified SRAM bit cell in FIG. 4 and FIG. 5 does not pass the physical verification step, because the strict design rules of a design rule check (DRC check) are not complied with. For the particular design layout at hand, a design rule violation-indicated as 'Err' in FIG. 5—will be detected due to the narrow gap that exists between the inter-tier via (e.g., V1 or V2) and the write word line trace 42 formed on the M1 metal layer of the bottom tier BEOL stack. A design rule check does not only require minimum dimensions (e.g., length and/or width) for the inter-tier vias and the write word line trace, but also enforces minimum spacing between them in order to avoid short-circuit formation between the inter-tier vias and the write word line trace. Any short-circuit would compromise the functionality of the multiport SRAM cell. A minimum spacing also provides a safeguard against inevitable variations in the exact placement of the memory cell components, in particular the inter-tier vias with relative to the write word line trace, during fabrication. The more advanced the technology nodes are, the stricter the design rules are with respect to the design layout, especially for sub-5 nm technology nodes that are frequently used to create very dense, low-power SRAM memory arrays.

Considering the example of inter-tier via dimensions of 20 nm by 20 nm at the via base (minimum dimensions), an inter-tier via pitch of 40 nm, an inter-tier via-to-Mint minimum spacing of 15 nm (minimum spacing to adjacent Mint traces, not counting the Mint trace that is in direct contact with the via), and a minimum width of 21 nm for line traces on the M1 metal layer, a required minimum spacing for fabrication between inter-tier vias and the write word line trace on the M1 metal layer would be about 10 nm. However, the modified 6T SRAM bit cell design studied in FIG. 4 and FIG. 5 fails to guarantee this minimum spacing—in fact, the spacing amounts to about 1.4 nm in this design—and a physical multiport SRAM bit cell cannot be fabricated based on this design. Therefore, a different solution for designing the layout of a two-tier multiport SRAM cell is needed, which leads to design layout of the multiport SRAM cell that can be fabricated. One such solution is now described.

According to a first aspect, a memory cell memory cell for use in register files is provided, e.g., a multiport SRAM bit cell. As discussed with reference to FIG. 3, the memory cell comprises two vertically stacked tiers: a bottom tier and a top tier. A memory cell can be partitioned to have a latching circuit and at least one write port located in the bottom tier and at least two read ports located in the top tier. Both the bottom tier and the top tier can include an active device layer and a metal layer stack which is formed over the active device layer. The top tier may only comprise n-channel devices (e.g., n-channel FETs) in its active device layer, whereas the bottom tier may comprise both n-channel and p-channel devices (e.g., n- and p-channel FETs or, e.g., combined n- and p-channel FETs as in CMOS). The metal layer stack can provide the interconnect structure of the memory cell. Moreover, the bottom and top tier can be electrically interconnected, in the memory cell, through a pair of vias (e.g., inter-tier vias) so that the internal states memorized by the latching circuit can be supplied to the top tier, where they can be read from the read ports. The memory cell further can include a word line trace for controlling the at least one write port. This write word line trace can be formed from interconnected metal wires of the bottom tier metal layer stack and can include two terminal sections and one intermediate section. The intermediate section can be oriented substantially perpendicularly to each one of the two terminal sections and can be arranged between the pair of vias in a height direction of the memory cell. In other words, the write word line trace can form a step in a top-down view of the memory cell, which step can be located between the positions of the two vias in the height direction of the memory cell. In general, the height direction of the memory cell is considered to be the direction perpendicular to the channel length of transistors patterned in the active device layers. Furthermore, since there is a correspondence between the geometric features, e.g., shapes and lines, of a design layout of an integrated circuit and the patterned features in the material layers of the physically fabricated integrated circuit, it will be clear to those skilled in the art that the physical memory cell can be described in terms of its design layout and vice-versa.

The memory cell may be part of an integrated circuit, e.g., part of an integrated circuit die. The integrated circuit may comprise a plurality of such memory cells, which can be arranged into a memory array structure. The memory cell may be part of an integrated circuit register file, binary CAM, in-memory computing device, or other memory-based circuits. Preferably, 3D sequential integration technology is used to vertically stack the bottom and top tier of the memory cell. In some embodiments, active devices patterned into the active device layers of the bottom tier and top tier may be implemented in CMOS technology, for example, using NMOS and PMOS devices. In other embodiments, active devices on the active device layer of the bottom tier may include both n- and p-type devices, for example NMOS and PMOS FETs, while active devices on the active device layer of the top tier may include only one of n-type and p-type devices (e.g., either NMOS FETs or PMOS FETs).

An embodiment is now described with reference to FIG. 6 and FIG. 7, which show the design layout of a partitioned multiport 6T SRAM cell in a top-down view for both the bottom tier and the top tier. Cell boundaries in the bottom and top tier are indicated by dashed contour lines in FIG. 6. It is noted that FIG. 7 shows the same design layout of the SRAM bit cell as FIG. 6, but with a reduced number of visible layout layers in the top and bottom tier (e.g., poly/gate layer, M0 layer for contacting the buried or backside power supply lines and write bit lines, transistor fins in the active device layer and inter-tier vias) so that the placement of the inter-tier vias in the bit cell and the transistors of the bottom and top tier are distinguished more easily.

The partitioning of the multiport SRAM bit cell over a bottom and top tier corresponds to the one described with respect to FIG. 3. According to this partitioning, two isolated read ports RP1 and RP2 are decoupled from the write port WP of the bottom tier and provided separately on a top tier of the multiport bit cell, which top tier can be vertically stacked onto the bottom tier. More precisely, sequential 3D integration can be used to stack the top tier vertically onto the bottom tier, such that a lower surface of the front-end-of-line portion of the top tier abuts on an upper surface of the bottom tier metal layer stack (e.g., the back-end-of-line stack of the bottom tier). Here, the upper surface of the bottom tier metal layer stack is opposite to the lower surface of the bottom tier front-end-of-line portion (e.g., lower surface of the semiconductor substrate on which or in which the active device layer of the bottom tier is formed). Likewise, an upper surface of the top tier metal layer stack is opposite to the lower surface of the top tier front-end-of-line portion (e.g., lower surface of the semiconductor substrate on which or in which the active device layer of the top tier is formed).

The SRAM bit cell 60, according to the design layout of the present embodiment, is 180° rotationally symmetric about its center. The bottom tier portion of the multiport SRAM bit cell 60 corresponds to a thin SRAM bit cell having a six-transistor core portion, for example according to the previously-described thin cell. The bottom tier can comprise a front-end-of-line (FEOL) portion, which can include the active devices that are patterned into the semiconductor substrate (e.g., silicon), giving rise to a bottom tier active device layer. Active devices in the bottom tier active device layer can include, but are not necessarily limited to, the four transistors T1-T4 that form the latching circuit (e.g., a pair of cross-coupled inverters) and the two transistors WP-1, WP-2 that constitute the write port WP to the internal storage nodes of the SRAM bit cell.

Moreover, bit cell contact pads 13*a-b*, 14*a-b*, and 15*a-b*, as well as inter-transistor connections 18, can be formed on and partially underneath the bottom tier active device layer of the SRAM bit cell 60, for example in an M0 metallization layer which is not part of the bottom tier metal layer stack. These M0 metal contacts can be self-aligned with the transistor gates on the active device layer and can be directly in contact with the silicon cpi, hence not requiring any intra-tier vias. Contact pads 13*a-b* can connect transistor junctions, where present, to the positive supply voltage rail (e.g., VDD power rail, not shown) and bit cell contact pads 15*a*. 15*b* can connect (different) transistor junctions, where present, to the reference supply voltage rail (e.g., VSS or GND power rail; not shown). In contrast thereto, contact pads 14*a*, 14*b* can connect transistor junctions of the write port to the differential pair of write bit lines (not shown). The power rails (e.g., VDD and VSS), as well as the write bit lines, which can be buried in the bottom tier substrates (e.g., underneath the active device layer) or provided on the backside of the bottom tier substrate (which can also be underneath the active device layer). However, this configuration of the power supply rails and write bit lines is not limiting; other embodiments of the disclosure may provide the power supply rails and/or write bit lines within the metal layer stack, e.g., in the BEOL stack, and connect them vertically, through lower metal layers of the interconnect structure, to the respective transistor junctions. Likewise, the transistor-transistor connections 18 (internal node) may be implemented in the metal layer stack instead.

The top tier portion of the multiport SRAM bit cell 60 can comprise an FEOL portion, which can include the active devices that are patterned into the semiconductor substrate (e.g., silicon), giving rise to a top tier active device layer. Active devices in the top tier active device layer can include, but are not necessarily limited to, the four transistors RP1-1, RP1-2, RP2-1 and RP2-2 that form the two isolated read ports RP1 and RP2 from which the internal storage nodes of the SRAM bit cell 60 can be read out. Bit cell contact pads 16*a-b* and 17*a-b*, as well as inter-transistor connections 19, can be formed underneath the top tier active device layer of the SRAM bit cell 60, for example in the M0 metallization layer which is not part of the top tier metal layer stack. Contact pads 16*a-b* connect transistor junctions, where present, to the reference supply voltage rail (e.g., VSS or GND power rail; not shown) and bit cell contact pads 17*a*, 17*b* can connect transistor junctions of the read ports RP1, RP2 to the respective single-ended read bit line (not shown). The power rails (e.g., VDD and VSS), as well as the read bit lines can be buried in the bottom tier substrates (e.g., underneath the active device layer) or provided on the backside of the bottom tier substrate (e.g., also underneath the active device layer). However, this configuration of the power supply rails and read bit lines is not limiting; other embodiments of the disclosure may provide the power supply rails and/or read bit lines within the metal layer stack, e.g., in the BEOL stack, and connect them vertically, through lower metal layers of the interconnect structure, to the respective transistor junctions. Likewise, the transistor-transistor connections 19 may be implemented in the metal layer stack in alternative embodiments.

In the bottom and the top tier, a metal layer stack can be formed over the FEOL portion, e.g., over the bottom and top tier active device layer, respectively. These metal layer stacks can comprise a plurality of metal/metallization layers and inter-metal dielectrics, and can form the interconnect fabric of the SRAM bit cell and, more generally, the interconnect structure of the integrated chip comprising a plurality of such SRAM bit cells. The metal layer stack of each tier can include a back-end-of-line (BEOL) stack and a middle-of-line (MOL) stack, wherein the MOL stack is interposed between and electrically contacts the tier's active device layer and the BEOL stack. In the SRAM bit cell 60, the bottom tier MOL stack contains a single metallization layer, Mint, for connecting the cross-coupled inverters of the latching circuit and for contacting the write word line trace 62 with the transistor gates of the write port. The intra-tier vias V1, V2 connect the read port gates (e.g., gates of RP1-1 and RP2-1) on the top tier to the internal metal layer Mint of the bottom tier. For example, they can extend vertically downwards from a lower (substrate-sided) face of the read port gates/poly lines on the top tier and land on an upper face (facing the BEOL stack) of the internal metal layer Mint on the bottom tier. Virtual projections of the inter-tier vias onto the gates/poly lines of the latching circuit on the bottom tier active device layer are displayed with a dashed contour in FIG. 7, indicating that the inter-tier vias do not abut directly on the gates/poly lines of the latching circuit, but abut on metal traces formed on the internal metal layer Mint (not shown in FIG. 7) of the bottom tier MOL stack instead, which Mint metal traces, in turn, abut directly on the gates/poly lines of the latching circuit.

With a cell height dimension corresponding to nine times the MMP of the bottom tier metal layer stack, more precisely nine times the MMP of the Mint layer (e.g., six Mint tracks, with a track spacing of 1.5*MMP), the design layout of the bit cell 60 is still relatively compact, although less compact than a five-track, six-transistor planar SRAM cell in thin format with buried power rails (BPR) or backside power distribution network BS-PDN). The minimum metal pitch (MMP) or interconnect pitch is defined as the smallest possible distance between the centers of adjacent wires on interconnect metal layers, in the present case between adjacent wires of the internal layer Mint of the MOL stack, and is usually determined by the space needed to drop intra-tier vias onto the adjacent wires. Although an even more compact variant of the bit cell 60 can be obtained by reducing the track spacing to 1.0*MMP, resulting in a cell height of 6.0*MMP, the present bit cell 60 offers lower resistance and cost by using evenly distributed Mint tracks at a nonminimum pitch. With regard to the MOL stack of the top tier, a single metallization layer, Mint, is provided for contacting the read word line traces 61-1 and 61-2 with the access transistor gate of the corresponding read port RP1-2 and RP2-2, respectively.

However, not all chipmaking foundries implement a MOL stack in all their process flows. Therefore, the contacts (e.g., conductive plugs such as tungsten plugs) and wiring of the MOL stack may be transferred to the lower, e.g., first and second, metallization layers of the BEOL stack in alternative embodiments of the SRAM bit cell 60. Here, the ordinal numbering of the metallization layers of the metal layer stack (e.g., first metal layer, second metal layer, etc.) is increasing towards the upper surface of the metal layer stack and decreasing towards the FEOL portion of the bottom tier. Expressed differently, metal layers of the interconnect structure are assigned a higher ordinal number the more distantly they are located with respect to the active device layer. It is noted that in the presence of a MOL stack in the interconnect structure, the first metal layer of the BEOL stack does not correspond to the first metal layer of the metal layer stack/interconnect structure, but may correspond to the second, third, or any higher-ranked metal layer thereof, depending on how many metal layers the MOL stack includes. Moreover, reference signs for the metal layers of the metal layer stack may follow a different numbering scheme, e.g., Mint designating the (single) metal layer of the MOL stack and M1, M2, etc. designating the metal layers of the BEOL stack. The same numbering scheme of metal layers in the metal layer stack applies to the top tier (with or without a MOL stack).

Figure 6:
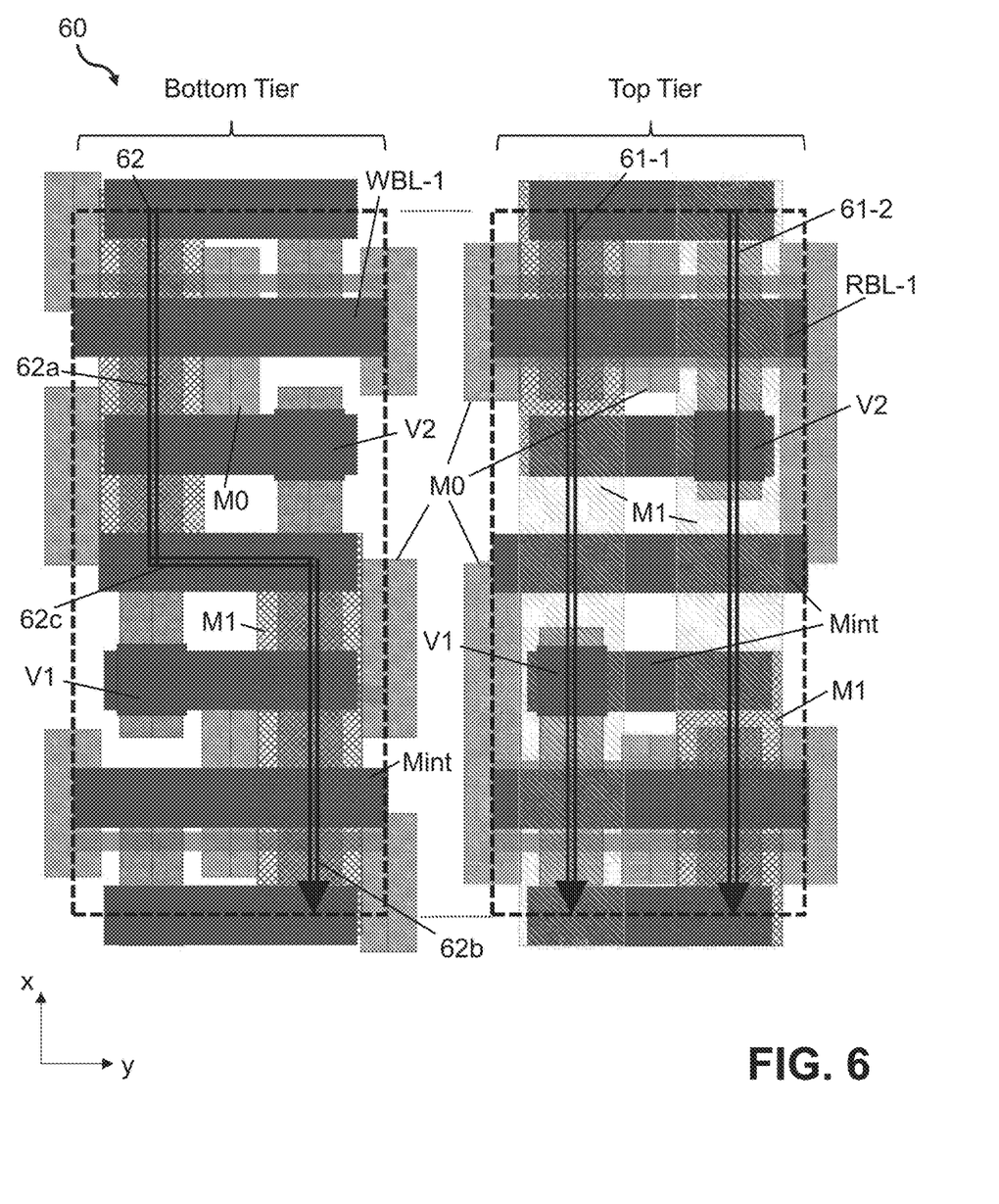
FIG. 6 shows the design layout of a partitioned multiport 6T SRAM cell in top-down view for both the bottom tier and the top tier, in accordance with an embodiment of the disclosure.
Figure 7:
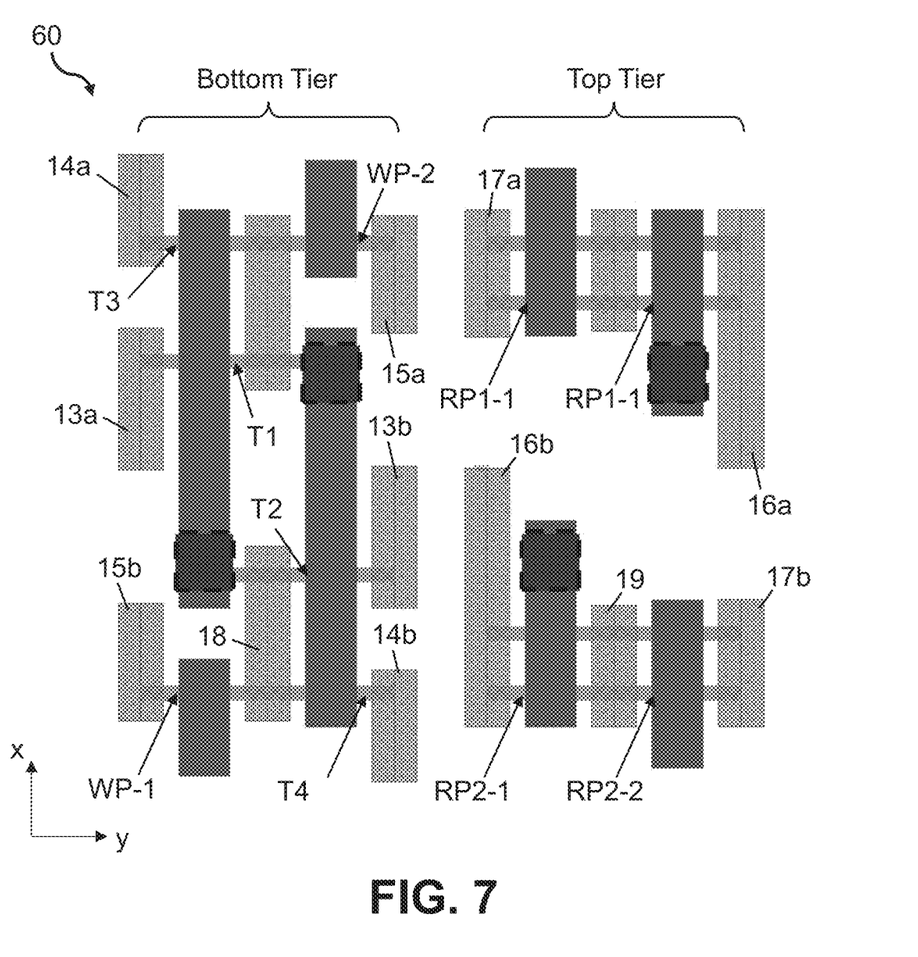
FIG. 7 shows a reduced number of layers for the same design layout as FIG. 6.

In FIG. 6, the word line trace 62 is composed of two straight terminal sections 62a and 62b and an intermediate section 62c that is oriented perpendicularly to each one of the two terminal sections 62a, 62b. The two terminal sections extend in the direction of the cell height, x, and are formed on the first metallization layer M1 of the bottom tier BEOL stack (corresponding to second metallization layer of bottom tier metal layer stack, including the bottom tier MOL stack), whereas the intermediate section 63 extends in the direction of cell width, y, and formed on the internal metal layer Mint of the bottom tier MOL stack (corresponding to first metallization layer of bottom tier metal layer stack). Intra-tier vias, as opposed to inter-tier vias V1 and V2, connect the intermediate section 62c with each of the terminal sections 62a, 62b. This means that the write word line 62 is formed, at least in the present embodiment, on two adjacent metal layers of the bottom tier metal layer stack. Only the M1 layer of the bottom tier BEOL stack is shown in the figure, but in general, the bottom tier BEOL stack contains up to two or three metal layers, or even more than three metal layers.

In the present embodiment, a metal routing direction of the lowest (e.g., at least up to the second, third, or fourth layer) or all metallization layers in the bottom and top tier metal layer stack is substantially unidirectional, meaning that metal lines, wires, contact pads, and the like are extending along a single, principal direction in each metal layer of the metal layer stack. Additionally, the principal routing direction alternates between adjacent metallization layers of the set of restricted routing metallization layers of the metal layer stack/interconnect structure, e.g., alternating between preferential routing in the y-direction and the x-direction. Therefore, the write word line trace 62 on the first metal layer M1 of the bottom tier BEOL stack is oriented perpendicularly to the contact wire traces on the metal layer Mint of the bottom tier MOL stack. Restricting or partially restricting the alternating patterning directions (e.g., one-dimensional instead of two-dimensional) of the lower metallization layers of the interconnect structure is a common design rule to be obeyed in advanced technology nodes, e.g., for sub-5 nm nodes. In embodiments, the metal layer(s) of the bottom and/or top tier MOL stack may comprise tungsten, cobalt, or ruthenium as conductive fill material. The bottom and/or top tier BEOL stack may comprise copper as conductive material for the metal layer traces and intra-tier vias, while the lower metallization layers of the bottom and/or top tier BEOL stack may comprise copper or cobalt as conductive material for the metal wire traces and intra-tier vias. The inter-tier vias are preferably comprising cobalt or a refractory metal/metal alloy.

It can be seen from FIG. 6 that the write word line trace 62 may not be straight, but rather may be angled or zig-zagging; the write word line trace 62 can comprise a step in a top-down view of the memory cell 60 (e.g., the intermediate section 62c), at a cell height coordinate that is situated between the respective cell height coordinates of the inter-tier vias V1 and V2. Besides, the write word line trace 62 does not touch or cross the cell boundary in the cell height direction x. Changing the routing direction of the write word line trace 62 between the locations of the pair of inter-tier vias V1, V2 along the cell height direction solves the spacing constraint issue between M1 metal traces and the inter-tier vias, although at the cost of increasing the cell height dimension by one track, e.g., one MMP for the internal metal layer of the bottom MOL stack. Everywhere in the SRAM bit cell 60, the different sections of the write word line trace can be separated from the inter-tier vias V1 and V2 by more than the minimum spacing distance. Referring back to the example given in respect of FIG. 4, the minimum M1-to-inter-tier via spacing of at least 10 nm (e.g., between 10 nm and 15 nm) is satisfied and the SRAM bit cell 60 is thus manufacturable.

In contrast to the twist in the write word line, which changes direction at mid-height of the memory cell 60 axis, e.g., by taking a turn in the intermediate section 62c (e.g., bent section) so that the two terminal sections 62a, 62b are offset or shifted relative to each other in the cell width direction y (e.g., displaced by one contacted poly pitch CPP), the read word lines 61-1 and 61-2 can be implemented as straight metal wire traces in a top-down view of the memory cell 60. The word lines can run across the entire height of the memory cell 60. The read word lines 61-1, 61-2 may be implemented as interconnected metal wire traces on the first and third metal layer M1, M3 of the top tier BEOL stack. Using two metal layers for the read word line routing has the advantage that the resistance along the read word line paths can be reduced. Yet, other embodiments of the disclosure may implement the read word lines as metal wire traces on a single metal layer of the top tier BEOL stack, for example only on the first metal layer M1 of the BEOL stack.

The transistors of the active layer of the bottom tier, e.g., the transistors of the latching circuit and the write port, may be implemented in CMOS or CMOS-compatible technology, e.g., as fin field effect transistors (FinFETs), where each FinFET may include one or more fins. FinFETs, e.g., compared to bulk transistors, benefit from a high threshold voltage and have a good on/off current ratio, which allows for lower leakage currents and standby power. They also allow tuning of the threshold voltage via the back-gate voltage so that improved read/write performance can be obtained. Transistors of the bottom tier are not limited to FinFETs, but may also be implemented as, for example, gate-all-around transistors, nanosheet transistors, mixed Fin-FET on nanosheet transistors, 2D material transistors or, if the use of advanced technology nodes is not paramount, also conventional 3D bulk MOSFETS. Similarly, transistors of the top tier, e.g., the transistors of the read ports, can be implemented as FinFETs, gate-all-around transistors, nanosheet transistors, mixed FinFET on nanosheet transistors, 2D material transistors, or 3D bulk MOSFETS. Preferably, the transistor type and transistor pitch (e.g., pitch-matched tiers having same CPP) are the same for the bottom and top tier, but this is not a strict requirement. Even though the transistor type can be the same, their drive current characteristics or channel widths may differ in the bottom and top tier. For instance, FinFETs of the top tier active device layer may have two fins to improve read speed, while FinFETs of the bottom tier active device layer may only have one fin. Moreover, a transistor orientation in the active device layers of the bottom and top tier can be preferably the same, e.g., the transistor gates/poly lines extend in the same direction (e.g., cell height direction x in FIG. 6 and FIG. 7), and transistor channels/fins are aligned along a same direction (e.g., cell width direction y) in both tiers.

In a second aspect, this disclosure relates to memory structures that contain an array of SRAM bit cells of the first aspect. Such memory structures may correspond to a simple tiling of a plurality of SRAM bit cells into a larger array structure, but generally relate to integrated circuitry that comprises further functional circuitry, such as control circuitry, readout circuitry, logic circuitry operating on the variables stored in the SRAM array, in addition to the sole array of SRAM bit cells. Exemplary memory structures of this kind, which can all qualify as AuC structures, include register files, binary CAM, cache memories, and in-memory computing devices like binary in-memory compute circuitry and binary neural networks.

Figure 8:
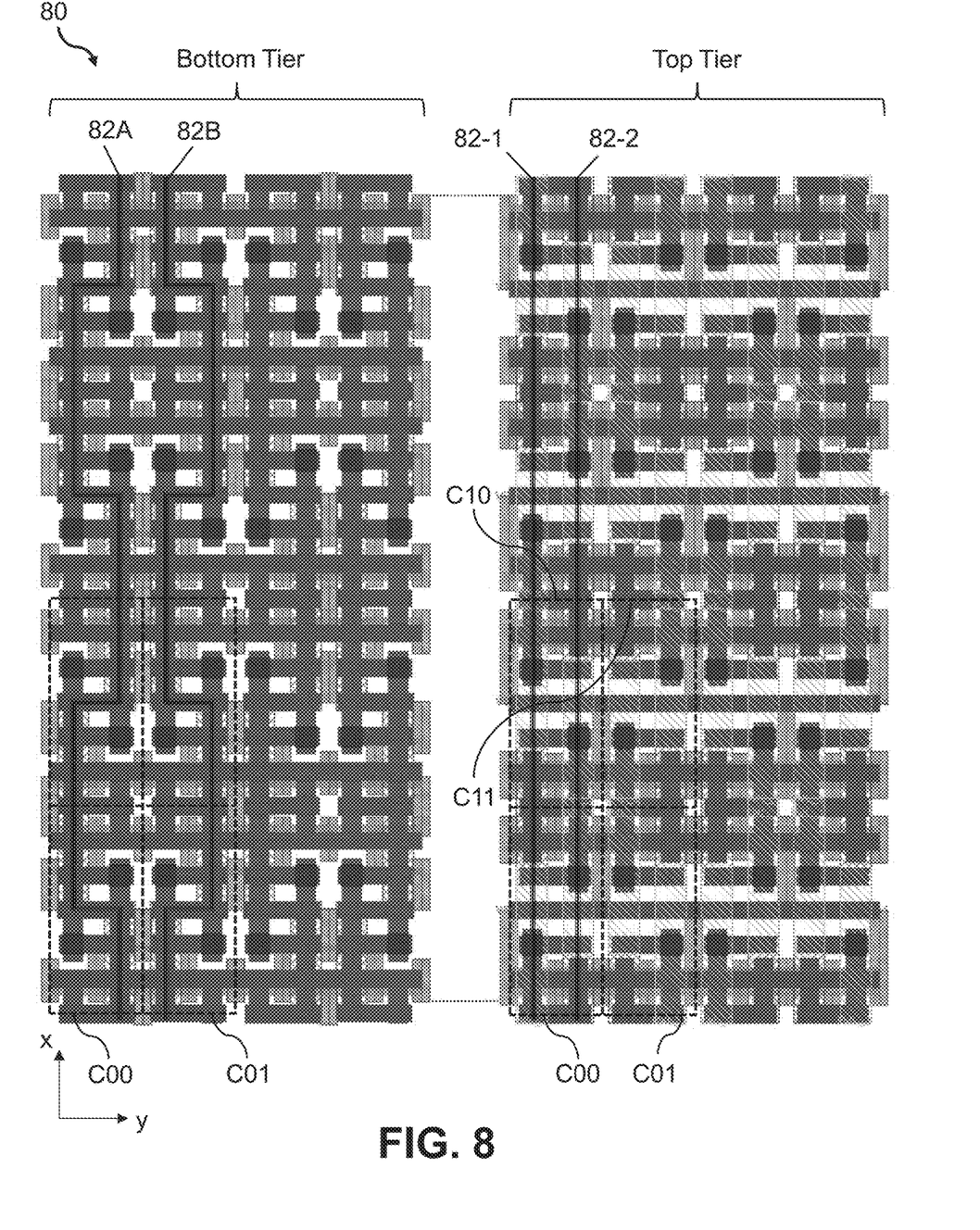
FIG. 8 shows a design layout for a tiling of true multiport SRAM bit cells, in accordance with embodiments of the disclosure, into a 4×4 array in a top-down view for both the bottom tier and the top tier.

Referring now to FIG. 8, an example design layout for a tiling of true multiport SRAM bit cells into a 4×4 array of a memory structure, e.g., pertaining to a register file, binary CAM, or in-memory computing device, is shown in a top-down view for both the bottom and top tier. The boundaries of individual bit cells C00, C01, C10 and C11, which all join in one point, are outlined in the figure. The tiling is obtained by first generating C10 as a mirrored copy of C00 (with the top boundary of cell C00 in x-direction being the mirror axis) and joining their boundaries into a common boundary. Next, the two joint cells C00 and C10 are mirrored once more (about their rightmost boundary in y-direction) to generate mirrored replica C01 and C11. Again, the overlapping boundaries after the mirror operation are merged into a common boundary. These four bit cells now form an enlarged unit that can be replicated over the whole array.

As a result of the tiling action, the write word lines 82A and 82B of the bottom tier (not all the write word lines of the array 80 are shown) each can form a meandering or crenellated path along the x-direction, e.g., along a same row of multiport SRAM bit cells in the array 80. The crenellated path of the write word line 82B associated with the second row of SRAM bit cells can be phase-shifted by 180° relative to the crenellated path of the write word line 82A associated with the first row of SRAM bit cells. As the individual bit cells in the array share their contacts on a common boundary, the write word lines 82A and 82B can be the continued paths obtained by concatenating the write word line traces 62 of adjacent bit cells in the same row of the array. In contrast thereto, the read word lines 82-1 and 82-2 (not all the read word lines of the array 80 are shown) each can have the shape of a straight line. Again, since individual bit cells in the array 80 share their contacts on a common boundary, the write word lines 82-1 and 82-2 can be the continued paths obtained by concatenating the read word line traces 62-1 and 62-2 of adjacent bit cells in the same row of the array. Next to the contact sharing with regard to the read and write word lines between adjacent cells in the array, also contacts for the supply voltages (e.g., VDD and VSS) and contacts to the read and write bit lines can be arranged on the cell boundary and can thus be shared among adjacent memory cells in the array, for example shared by adjacent memory cells of the same column (y-direction in FIG. 8).

Figure 9:
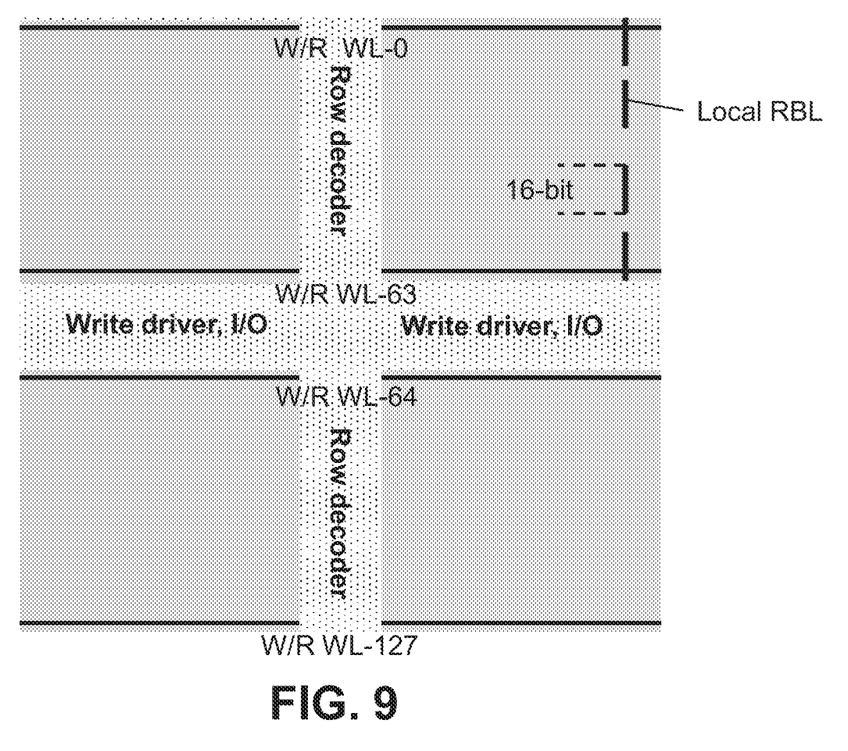
FIG. 9 illustrates how leaf arrays of SRAM bit cells in accordance with embodiments of the disclosure can be tiled into bigger arrays.

FIG. 9 illustrates how leaf arrays of SRAM bit cells can be tiled into bigger arrays, e.g., by rotating and tiling the leaf arrays in the four quadrants of a common orthogonal coordinate system. Write driver circuitry and I/O circuitry (e.g., readout circuitry and global I/O) of vertically adjacent leaf arrays can be combined and arranged along the horizontal axis of the coordinate system, while row decoder circuitry of horizontally adjacent leaf arrays can be combined and arranged along the vertical axis of the coordinate system. Write driver circuitry, I/O circuitry, and row decoder circuitry can be part of the top tier. In this example, each leaf array comprises 64 rows and 64 columns of SRAM bit cells according to the first aspect of the disclosure. As a result, the row decoder circuitry portion that is associated with the upper two leaf arrays is addressing write and read word lines ('W/R WL' in FIG. 9) of rows 0-63, while the row decoder circuitry portion that is associated with the lower two leaf arrays is addressing write and read word lines of rows 64-127. The number of SRAM bit cells per row and column of the leaf arrays depends on the particular application and may thus vary from embodiment to embodiment. Read bit lines of the leaf arrays run vertically and connect to the I/O block. Each read bit line is segmented into a collection of local read bit lines, where each local read bit line spans over, for example, 16 rows of SRAM bit cells. This helps to reduce the RC-constant associated with the read bit lines and improves the read speed.

While various embodiments have been illustrated and described in detail in the drawings and foregoing description, such illustration and description are to be considered illustrative or exemplary and not restrictive. The foregoing description details certain embodiments. It will be appreciated, however, that no matter how detailed the foregoing appears in text, the inventive aspects herein may be practiced in many ways. Accordingly, the present disclosure is not limited to the specifically disclosed embodiments.

Variation of the memory cell, not yet described explicitly hereinabove, may be obtained by changing the number of read and/or write ports in the SRAM bit cell. For instance, more than just one write port, for example between two and four independent write ports, can be implemented in the bottom tier of the bit cell. Consequently, the core portion of multiport SRAM cells with more than just one single write port includes a larger number of transistors, for example eight transistors for two write ports. Furthermore, a write-assist transistor may be added to one or more. (e.g., all) of the write ports. Each write port may be implemented either as a single-ended port or as a double-ended port (differential ports).

Similarly, more than two read ports may be implemented in the top tier, e.g., between two and eight read ports. Each read port may be implemented either as single-ended or as double-ended port, and each read port may be an isolated port or a non-isolated port (e.g., destructive reads). In preferred embodiments, write ports of the memory cell can be double-ended in order to facilitate breaking the feedback loop of the latching circuit, thereby reducing write latency, while read ports can be single-ended so that the number of read bit lines is reduced and die area saved.

In alternative embodiments of the disclosure, at least the bottom tier (e.g., the bottom tier and the top tier) may not have a MOL stack formed over the tier's active device layer. In such embodiments the first metal layer, e.g., M1 layer, of the BEOL stack can replace the internal metal layer Mint of the MOL stack, the second metal layer (e.g., M2 layer) of the BEOL stack can replace the first metal layer M1 of the BEOL stack, the third metal layer (e.g., M3 layer) of the BEOL stack can replace the second metal layer M2 of the BEOL stack, and so forth. Moreover, the intermediate section of the write word line trace can be formed on the second metal layer (e.g., M2 layer) of the bottom tier BEOL stack, and the terminal sections of the write word line can be formed on the first metal layer (e.g., M1 layer), of the bottom tier BEOL stack. If the lower metal layers of the bottom tier BEOL stack are unrestricted with regard to their metal routing direction (e.g., supporting two-dimensional metal routing) then both the terminal sections and the intermediate section of the write word line can be formed on the first metal layer (e.g., the two-dimensional M1 layer) of the bottom tier BEOL stack. Moreover, the inter-tier vias can preferably land on the M2 layer of the bottom tier devoid of an MOL stack. The inter-tier vias can also land on the M1 layer of the bottom tier (without MOL stack), provided that the routing of the write word line trace moves up in the bottom tier BEOL stack, (e.g., the write word line trace being formed on the M3 layer (if unrestricted two-dimensional routing is allowed)) or formed on the M4 layer (terminal sections) and the M3 layer (intermediate section).

In some embodiments, the transistors of the bottom tier (e.g., containing an array of core portions of SRAM bit cell according to the first aspect, thus having memory functionality) can be configured to have a mid-bandgap threshold voltage, while transistors of the top tier (e.g., transistors of the read ports of SRAM bit cell according to the first aspect) can be configured to have a large-bandgap threshold voltage. Mid-bandgap threshold voltage transistors in the bottom tier can be more resilient to the thermal treatment during the sequential 3D integration process, e.g., same thermal treatment for the bottom and top tier, thus resulting in more predictable and reliable device performance. A modification of the gate stack (e.g., gate stack materials in view of their different work functions) in transistors of the bottom tier active device layer is one means to obtain a mid-bandgap threshold voltage.

Figure 10:
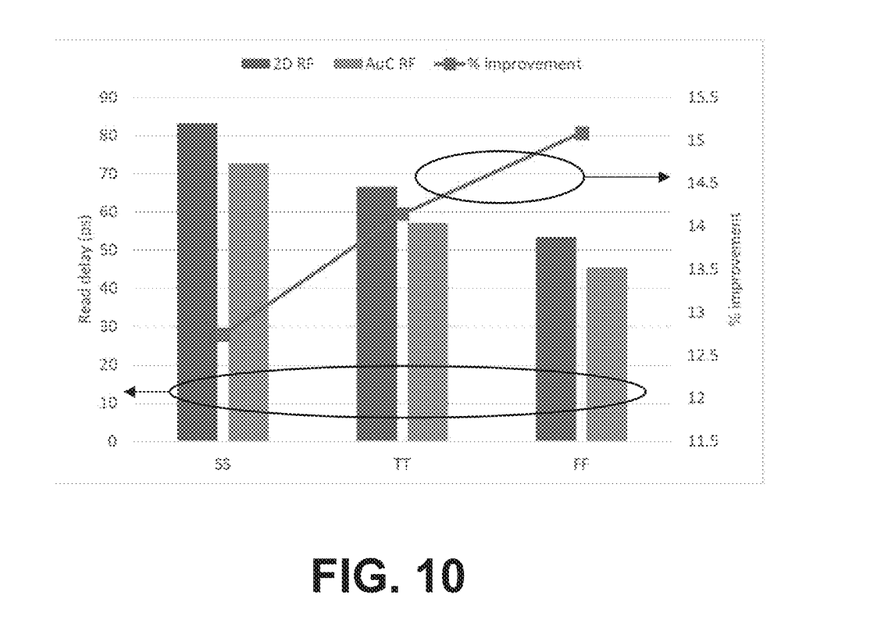
FIG. 10 is a combined bar chart and graph that compares the performance gains and footprint reduction of a multiport register file, using an array of SRAM bit cells according to embodiments of the disclosure, relative to a conventional planar multiport register file.

FIG. 10 compares the performance gains and footprint reduction of a multiport AuC register file, using an array of SRAM bit cells according to the first aspect, relative to a conventional planar multiport register file, based on a planar array of SRAM bit cells, for example as shown in, FIG. 2. This comparison, which is based on simulation, assumes mid-bandgap threshold transistors in the bit cell core portion, in the bottom tier. As demonstrated by the bar charts, the multiport AuC register file implementation outperforms the conventional planar multiport register file implementation in terms of read delay across the following NMOS/PMOS process corners: FF (fast-fast), TT (typical-typical) and SS (slow-slow). This corresponds to a performance improvement of about 13%. At the same time, the vertically stacked architecture of the multiport AuC register file implementation yields a 40% footprint reduction as compared to the conventional planar multiport register file implementation.

In yet another aspect, the disclosure relates to a method of manufacture of a multiport memory cell according to the first aspect. The method comprises the following steps:

vertically stacking a top tier and a bottom tier, each tier comprising an active device layer and a metal layer stack;

arranging a latching circuit and at least one write port of the memory cell in the bottom tier and arranging at least two read ports of the memory cell in the top tier;

electrically interconnected the bottom and top tier through a pair of vias;

interconnecting metal wires of the bottom tier metal layer stack to form a write word line trace for controlling the at least one write port.

The write word line trace can include two terminal sections and one intermediate section that can be oriented substantially perpendicularly to each one of the two terminal sections. Additionally, the intermediate section can be arranged between the pair of vias in a height direction of the memory cell.

More than one memory cell may be fabricated in this way in a single fabrication flow. For example, a whole array of such memory cells may be fabricated on wafer-scale.

Orienting the intermediate section of the write word line trace perpendicularly to the terminal sections and arranging the intermediate section between the pair of vias in a height direction of the memory cell may relate to steps that are performed as part of a design layout creation of the memory cell.

Likewise, the steps of arranging the latching circuit and the at least one write port of the memory cell in the bottom tier and arranging the at least two read ports of the memory cell in the top tier may relate to steps that are performed as part of a design layout creation of the memory cell. The placing of the pair of vias and of the metal wires of the bottom tier metal layer stack that form the write word line trace may also be performed as part of the design layout creation.

Transistors of the bottom tier active device layer may be designed and processed to have a mid-bandgap work function (for the channel-forming region) as opposed to transistors of the top tier active device layer, which may be designed and processed to have a large-bandgap work function. Refractory metals or metal alloys may be used as conductive material in the metal layer stack of the bottom tier, for example including metal wires or wire traces on the metallization layers of the MOL and/or BEOL stack, contacts, contacts pads, and vias (inter-tier and/or intra-tier). This enables the use of a higher thermal budget in relation to the processing steps for the top tier, which can yield active devices (e.g., transistors) with improved performance characteristics, for example higher drive currents.

Patterning of the active device layer, and more specifically of the latching circuit and the at least one write port in the bottom tier of the memory cell and of the read port in the top tier of the memory cell, often involves a lithographic exposure step, followed by a chemical etch or implantation step. The same applies in general to the metallization layers of the metal layer stack. The lithographic exposure step may comprise one or more deep UV exposures, or extreme UV exposures, of one or more corresponding photomasks. Thereby, the geometric features of the photomask(s) are transferred into a light-sensitive layer, which is then used an etch mask with respect to one or more material layers that have been previously deposited onto the substrate of the bottom tier, or by analogy, on the substrate of the top tier.

Therefore, the present disclosure also relates to a set of photomasks, to be used in a photo-exposure step when manufacturing one or more memory cells of the first aspect.

The set of photomasks comprises geometric design features (e.g., lines and shapes such as e.g., polygons or triangles) which define the multiport memory cell, for example defining all of its components and contacts/connections. A first subset of a set of photolithography masks can include geometric design features which define a latching circuit and at least one write port to be transferred into an active device layer of a bottom tier. A second subset of the set of photolithography masks can include geometric design features which define two terminal sections and one intermediate section of a write word line trace to be transferred into one or more metallization layers when deposited over the active device layer of the bottom tier. A third subset of the set of photolithography masks can include geometric design features which define at least two read ports to be transferred into an active device layer of a top tier when vertically stacked onto the one or more metallization layers deposited onto the bottom tier. In some embodiments, the geometric design features (e.g., lines and shapes) of a single photomask may define corresponding features (e.g., transistors, metal traces, doping implant areas) on a material layer of the multiport memory cell. In some embodiments, the geometric design features of more than just a single photomask (e.g., two, three, four, or more photomasks) may be used to define the corresponding feature(s) on a material layer of the multiport memory cell. This is the case in multi-patterning techniques, for example "LELE", "LELELE", SADP (self-aligned double patterning), SATP (self-aligned triple patterning), etc.

The set of photomasks may be obtained in a photomask writing process, in which a computing device controls a photomask writing tool such as a laser beam or electron beam, such that the features written onto a layer of photoresist result in the geometric design features of the set of photomasks, after photoresist exposure, metal plating layer (e.g., chromium) etch, and photoresist removal have been carried out. The computing device may execute a control program for that purpose, where the control program uses a mask layout file as input.

Accordingly, this disclosure also relates to a computer-readable medium that stores information pertaining to a design layout of a memory cell of the first aspect. The stored information typically corresponds to a set of layers, wherein each layer defines the geometric features that appear on a corresponding photomask when the computer-readable medium is used as input to the computing device that controls the writing of the photomask set.

For instance, the computer-readable medium stores a design layout of a memory cell of the first aspect as a set of layout layers which define the multiport memory cell, for example defining all of its components and contacts/connections. A first subset of the set of the layout layers can comprise geometric design features which define a latching circuit and at least one write port to be transferred into an active device layer of a bottom tier. A second subset of the set of layout layers can comprise geometric design features which define two terminal sections and one intermediate section of a write word line trace to be transferred into one or more metallization layers when deposited over the active device layer of the bottom tier. A third subset of the set of layout layers can comprise geometric design features which define at least two read ports to be transferred into an active device layer of a top tier when vertically stacked onto the one or more metallization layers deposited onto the bottom tier.

Other variations to the disclosed embodiments can be understood and effected by those skilled in the art, from a study of the drawings, the disclosure, and the appended claims. In the claims, the word "comprising" does not exclude other elements or steps, and the indefinite article "a" or "an" does not exclude a plurality. Any reference signs in the claims should not be construed as limiting the scope.

What is claimed is:

1. A multiport memory cell, comprising:
   a bottom tier and a top tier, the bottom tier and the top tier stacked in a vertical direction of the memory cell and electrically interconnected through a pair of vias, wherein the bottom tier comprises a bottom tier active device layer and a bottom tier metal layer stack, wherein the top tier comprises a top tier active device layer and a top tier metal layer stack, and wherein a lower surface of the top tier active device layer abuts an upper surface of the bottom tier metal layer stack, wherein the pair of vias connects to a respective metallization level of first and second vertical metallization levels in the bottom tier with the active device layer of the top tier,
   wherein the memory cell has a cell width in a first lateral direction and a cell height in a second lateral direction crossing the first lateral direction,
   wherein the vertical direction is perpendicular to a plane defined by the first lateral direction and the second lateral direction,
   wherein the memory cell is partitioned to have a latching circuit and at least one write port located in the bottom tier and at least two read ports located in the top tier, and
   wherein a write word line trace for controlling the at least one write port is formed from interconnected metal wires of the bottom tier metal layer stack and comprises a first terminal section and a second terminal section extending in the first lateral direction at the first vertical metallization level over the bottom tier active device layer, wherein the first and second terminal sections are connected by an intermediate section extending in the second lateral direction at the second vertical metallization level different from the first vertical metallization level, the intermediate section being arranged laterally between the pair of vias in the first lateral direction.

2. The memory cell of claim 1, wherein the bottom tier metal layer stack includes a bottom tier middle-of-line (MOL) stack and a bottom tier back-end-of-line (BEOL) stack, the bottom tier MOL stack being interposed between the bottom tier active device layer and the bottom tier BEOL stack, wherein the first vertical metallization level is provided in a first metal layer of the bottom tier BEOL stack, closest to the bottom tier active device layer, and wherein the second vertical metallization level is provided in an internal metal layer of the bottom tier MOL stack, and wherein the bottom tier active device layer comprises the latching circuit, the latching circuit having a pair of cross-coupled inverters and two transistors, each of the two transistors configured to function as the at least one write port and connected to a storage node of a corresponding inverter of the pair of cross-coupled inverters.

3. The memory cell of claim 2, wherein each via of the pair of vias interconnects the internal metal layer of the bottom tier MOL stack with a transistor gate on the top tier active device layer, wherein the internal metal layer forms an internal storage node by connecting gates of transistors included in the corresponding inverter, wherein the transistor gate is a polysilicon gate of a corresponding drive transistor integrated in the top tier active device layer, and wherein each via is extending through the bottom tier BEOL stack and a substrate of the top tier active device layer.

4. The memory cell of claim 1, wherein the bottom tier metal layer stack includes a bottom tier back-end-of-line (BEOL) stack formed over the bottom tier active device layer, the first vertical metallization level is provided in a first metal layer of the bottom tier BEOL stack, closest to the bottom tier active device layer, and wherein the second vertical metallization level is provided in a second metal layer of the bottom tier BEOL stack, adjacent to the first metal layer.

5. The memory cell of claim 1, wherein a metal wire routing direction is substantially unidirectional in each metal layer of a subset of adjacent metal layers of the bottom tier metal layer stack, the subset of adjacent metal layers comprising at least the first and second vertical metallization levels, and the unidirectional routing direction alternating between the first lateral direction of the memory cell and the second lateral direction of the memory cell in adjacent metal layers of the subset of adjacent metal layers.

6. The memory cell of claim 1, wherein the memory cell is a thin memory cell having the cell width substantially equal to twice a contacted gate pitch of the bottom tier active device layer.

7. The memory cell of claim 1, wherein the height of the memory cell in the first lateral direction corresponds to six tracks in a first metal layer of the bottom tier metal stack, closest to the bottom tier active device layer.

8. The memory cell of claim 1, wherein the memory cell is a thin memory cell having the cell width substantially equal to twice a contacted gate pitch of the bottom tier active device layer, and
wherein the height of the memory cell in the first lateral direction corresponds to six tracks in a first metal layer of the bottom tier metal stack, closest to the bottom tier active device layer.

9. The memory cell of claim 1, wherein the at least two read ports of the top tier are connected to read word line traces formed from interconnected metal wires of at least a second or a fourth metal layer of the top tier metal layer stack, closest to the bottom tier.

10. The memory cell of claim 1, wherein the top and bottom tier are pitch-matched tiers with substantially equal connected poly-gate pitches in their respective active device layers.

11. The memory cell of claim 1, wherein the top tier is vertically stacked with the bottom tier such that the top tier active device layer faces towards the bottom tier metal layer stack and the top tier metal layer stack faces away from the bottom tier metal layer stack.

12. The memory cell of claim 1, wherein the top and bottom tier are pitch-matched tiers with substantially equal connected poly-gate pitches in their respective active device layers, and
wherein the top tier is vertically stacked with the bottom tier such that the top tier active device layer faces towards the bottom tier metal layer stack and the top tier metal layer stack faces away from the bottom tier metal layer stack.

13. The memory cell of claim 1, wherein a length direction of transistor channels of the bottom tier active device layer is oriented parallelly to a length direction of transistor channels of the top tier active device layer.

14. The memory cell of claim 1, wherein power rails of the memory cell are buried in a substrate underneath the active device layer of at least one of the bottom tier or the top tier.

15. The memory cell of claim 1, wherein the active layer of the bottom tier comprises a first plurality of transistors,
wherein the active layer of the top tier comprises a second plurality of transistors, and
wherein the first plurality of transistors of the bottom tier are different from the second plurality of transistors of the top tier.

16. The memory cell of claim 15, wherein the first plurality of transistors of the bottom tier comprise fin field effect transistors (FinFETs) each having one fin, and the second plurality of transistors of the top tier comprise FinFETs each having two fins.

17. A memory device comprising an array of memory cells, wherein each of the memory cells is according to the memory cells of claim 1,
wherein the memory cells are tiled into rows and columns, and
wherein adjacent ones of the memory cells of a same row share read port contacts thereof and write port contacts thereof along a common boundary.

18. The memory device of claim 17, wherein the memory device is configured as one of a register file, binary-CAM, or in-memory compute device.

19. A set of photolithography masks comprising geometric design features to lithographically define the multiport memory cell of claim 1, the set of photolithography masks comprising:
a first subset of the set of photolithography masks comprising geometric design features defining the latching circuit and the at least one write port to be transferred into the bottom tier active device layer;
a second subset of the set of photolithography masks comprising geometric design features defining the first and second terminal sections and the intermediate section to be transferred into the first and second vertical metallization levels when deposited over the bottom tier active device layer; and
a third subset of the set of photolithography masks comprising geometric design features defining the at least two read ports to be transferred into the top tier active device layer when vertically stacked onto the first and second metallization levels deposited onto the bottom tier.

20. The memory cell of claim 1, wherein a distance between each of the pair of vias and the intermediate section is at least 10 nm in the first lateral direction.

21. A method of manufacturing a multiport memory cell, the method comprising:
vertically stacking a top tier and a bottom tier, wherein the bottom tier comprises a bottom tier active device layer and a bottom tier metal layer stack, wherein the top tier comprises a top tier active device layer and a top tier metal layer stack, and wherein a lower surface of the top tier active device layer is abutted with an upper surface of the bottom tier metal layer stack;
arranging a latching circuit and at least one write port of the memory cell in the bottom tier and arranging at least two read ports of the memory cell in the top tier, wherein the memory cell has a cell width in a first lateral direction and a cell height in a second lateral direction crossing the first lateral direction, and wherein the vertical direction is perpendicular to a plane defined by the first lateral direction and the second lateral direction;

electrically interconnecting the bottom and top tier through a pair of vias laterally disposed in the first lateral direction; and interconnecting metal wires of the bottom tier metal layer stack to form a write word line trace for controlling the at least one write port, wherein the write word line trace comprises a first terminal section and a second terminal section extending in the first lateral direction at a first vertical metallization level over the bottom tier active device layer, wherein the first and second terminal sections are connected by, an intermediate section extending in the second lateral direction at a second vertical metallization level different from the first vertical metallization level, wherein the intermediate section is arranged between the pair of vias in the first lateral direction.

* * * * *

UNITED STATES PATENT AND TRADEMARK OFFICE
CERTIFICATE OF CORRECTION

PATENT NO. : 12,424,276 B2
APPLICATION NO. : 18/068330
DATED : September 23, 2025
INVENTOR(S) : Shairfe Muhammad Salahuddin It is certified that error appears in the above-identified patent and that said Letters Patent is hereby corrected as shown below:

On the Title Page

Column 1, Item (72) (Inventors), delete "Kessel Lo" and insert -- Kessel-Lo --.

In the Specification

Column 8, Line 51, delete "pads 14a. 14b" and insert -- pads 14a, 14b --.

Column 11, Line 33, delete "silicon cpi, hence" and insert -- silicon epi, hence --.

Column 11, Line 37, delete "pads 15a. 15b" and insert -- pads 15a, 15b --.

Column 16, Line 58, delete "or more. (e.g.," and insert -- or more (e.g., --.

In the Claims

Column 20, Claim 1, Line 22, delete "wherein the pair" and insert -- wherein each via of the pair --.

Signed and Sealed this
Sixteenth Day of December, 2025

John A. Squires
*Director of the United States Patent and Trademark Office*